United States Patent
Arvin et al.

(10) Patent No.: US 9,604,316 B2
(45) Date of Patent: Mar. 28, 2017

(54) TIN-BASED SOLDER COMPOSITION WITH LOW VOID CHARACTERISTIC

(71) Applicant: GLOBALFOUNDRIES INC., Grand Cayman (KY)

(72) Inventors: Charles L. Arvin, Poughkeepsie, NY (US); Mark S. Chace, Beacon, NY (US); Qin Yuan, Poughquag, NY (US); Nitin Jadhav, Wappingers Fall, NY (US); Janine L. Protzman, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 107 days.

(21) Appl. No.: 14/493,818

(22) Filed: Sep. 23, 2014

(65) Prior Publication Data

US 2016/0082551 A1    Mar. 24, 2016

(51) Int. Cl.

| | |
|---|---|
| B23K 31/00 | (2006.01) |
| B23K 31/02 | (2006.01) |
| B23K 35/26 | (2006.01) |
| B23K 35/36 | (2006.01) |
| B23K 35/02 | (2006.01) |
| B23K 1/20 | (2006.01) |
| C23C 18/48 | (2006.01) |
| H05K 3/34 | (2006.01) |

(52) U.S. Cl.
CPC ............. *B23K 35/262* (2013.01); *B23K 1/20* (2013.01); *B23K 35/0222* (2013.01); *B23K 35/3612* (2013.01); *C23C 18/48* (2013.01); *H05K 3/3473* (2013.01); *H05K 2203/044* (2013.01)

(58) Field of Classification Search
CPC . C08L 63/00; B23K 35/3615; B23K 35/0222; B23K 35/262; B23K 35/36; B23K 35/3612
USPC .......................... 564/250; 228/207, 223, 256
See application file for complete search history.

(56) References Cited

U.S. PATENT DOCUMENTS

| | | |
|---|---|---|
| 2,891,871 A | 6/1959 | Ceresa et al. |
| 3,855,085 A | 12/1974 | Rushmere |
| 3,977,949 A | 8/1976 | Rosenberg |
| 4,027,055 A | 5/1977 | Schneble, Jr. |
| 4,263,106 A | 4/1981 | Kohl |
| 4,405,663 A | 9/1983 | Kinkelaar et al. |
| 4,511,403 A | 4/1985 | Orio et al. |
| 4,606,987 A | 8/1986 | Matsuura et al. |
| 4,758,407 A | 7/1988 | Ballentine et al. |
| 4,806,309 A | 2/1989 | Tulman |
| 4,914,243 A | 4/1990 | Bauman |
| 5,266,103 A | 11/1993 | Uchida et al. |
| 5,288,727 A | 2/1994 | Toki et al. |
| 5,326,453 A | 7/1994 | Endicott et al. |
| 5,334,240 A | 8/1994 | Ferrier |
| 5,352,407 A | 10/1994 | Seelig et al. |
| 5,629,421 A | 5/1997 | Takesue et al. |
| 5,759,379 A | 6/1998 | Cavallotti et al. |
| 5,902,472 A | 5/1999 | Arai et al. |
| 6,077,866 A | 6/2000 | Kitagawa et al. |
| 6,316,605 B1 | 11/2001 | Yanagihara et al. |
| 6,326,510 B1 | 12/2001 | Bernardon |
| 6,361,823 B1 | 3/2002 | Bokisa et al. |
| 6,544,398 B2 | 4/2003 | Uchida et al. |
| 6,805,974 B2 | 10/2004 | Choi et al. |
| 6,835,514 B2 | 12/2004 | Jubran et al. |
| 7,189,483 B2 | 3/2007 | Danilevicius et al. |
| 7,193,067 B2 | 3/2007 | Chamberlain et al. |
| 7,202,002 B2 | 4/2007 | Tokarski et al. |
| 7,695,605 B2 | 4/2010 | Whitlaw et al. |
| 7,713,859 B2 | 5/2010 | Richardson et al. |
| 8,128,868 B2 | 3/2012 | Farooq |
| 8,314,247 B2 | 11/2012 | Takamuro et al. |
| 8,493,746 B2 | 7/2013 | Arvin et al. |
| 2005/0256180 A1* | 11/2005 | Bergmanis .......... C07D 231/54 514/406 |

FOREIGN PATENT DOCUMENTS

EP     0 220 118 A2    4/1987

OTHER PUBLICATIONS

STIC search Aug. 8, 2016.*
Ozga P., "Electrodeposition of Sn—Ag and Sn—Ag—Cu Alloys from Thiourea Aqueous Solutions", Archives of Metallurgy and Materials, vol. 51, Issue 3, pp. 413-421 (May 7, 2006).

* cited by examiner

*Primary Examiner* — Erin Saad
(74) *Attorney, Agent, or Firm* — Scully Scott Murphy and Presser

(57) ABSTRACT

A tin-based solder melt or aqueous tin plating bath composition comprising a source of tin and a stabilizing additive of chemical structure:

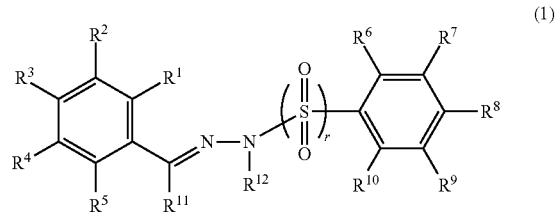

(1)

wherein $R^1$, $R^2$, $R^3$, $R^4$, $R^5$, $R^6$, $R^7$, $R^8$, $R^9$, and $R^{10}$ are independently selected from hydrogen atom, hydrocarbon groups R having at least one and up to twelve carbon atoms, groups OR' wherein R' is selected from hydrogen atom and hydrocarbon groups R, and halogen atoms, and wherein any two, three, or four of $R^1$, $R^2$, $R^3$, $R^4$, and $R^5$ or any two, three, or four of $R^6$, $R^7$, $R^8$, $R^9$, and $R^{10}$ are optionally interconnected to form a fused ring system; $R^{11}$ and $R^{12}$ are independently selected from hydrogen atom and hydrocarbon groups R; and r is either 0 or 1. Methods for coating and/or bonding metal substrates by use of the above-described solder compositions are also described.

20 Claims, No Drawings

TIN-BASED SOLDER COMPOSITION WITH LOW VOID CHARACTERISTIC

BACKGROUND

The present disclosure relates to tin-based solder melt and aqueous tin-based plating bath compositions and methods of coating a metal substrate using the tin-based composition.

Tin-based solder compositions are commonly used in microelectronics production to bond electronic or hardware components together. Of particular relevance is the use of solder in connecting electronic components (such as a chip) onto a printed circuit board.

A persistent problem encountered in the use of tin-based solder processes is the occurrence of voids in the solder coat. Voids are highly undesirable particularly since they result in a non-uniform coating and can result in bond failure. The occurrence of such voids typically decreases over time and may eventually become absent during long term use of the solder. As a result, a currently known remedy is to modify the process by including a "break-in" period before the solder is used in production. During the break-in period, which typically lasts for 10 to 16 days, the solder bath is kept molten and optionally used to plate dummy objects. The presence of voids can be monitored during the course of the break-in period to establish the point in time when the solder bath exhibits an acceptably low void output for use in production.

As the current requirement for a lengthy break-in period results in higher cost and lower production efficiency, it poses a significant problem in current microelectronics manufacturing. For this reason, there would be a significant advantage in a soldering process that eliminates the need for a break-in process and that provides high quality solder coats free of voids from the outset.

SUMMARY

In one aspect, the instant disclosure is directed to tin-based solder melt and aqueous tin-based plating bath compositions that advantageously provide high quality solder coats in the substantial absence of voids when used at the outset, i.e., without the need for a break-in period.

The improved solder composition has been achieved by including in the solder melt or aqueous tin-based plating bath a hydrazone-containing stabilizing additive.

In particular embodiments, the stabilizing additive is a compound having the following structure:

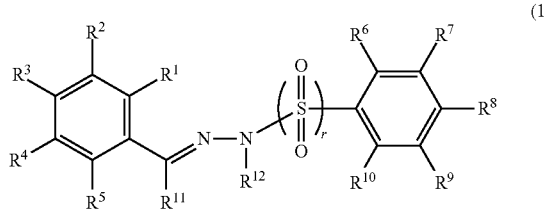

(1)

In Formula (1), $R^1$, $R^2$, $R^3$, $R^4$, $R^5$, $R^6$, $R^7$, $R^8$, $R^9$, and $R^{10}$ are independently selected from hydrogen atom, hydrocarbon groups R having at least one and up to twelve carbon atoms, groups OR' wherein R' is selected from hydrogen atom and hydrocarbon groups R, and halogen atoms, and wherein any two, three, or four of $R^1$, $R^2$, $R^3$, $R^4$, and $R^5$ are optionally interconnected to form a fused ring system; and wherein any two, three, or four of $R^6$, $R^7$, $R^8$, $R^9$, and $R^{10}$ are optionally interconnected to form a fused ring system; $R^{11}$ and $R^{12}$ are independently selected from hydrogen atom and hydrocarbon groups R having at least one and up to twelve carbon atoms; and the subscript r is either 0 or 1.

In another aspect, the instant disclosure is directed to methods of coating a metal substrate with a tin-based solder composition by contacting the metal substrate with the above-described solder melt or aqueous tin-based plating bath containing the stabilizing additive according to Formula (1). In the case of the aqueous tin-based plating bath, the process may be an electrodeposition process or an electroless (i.e., tin immersion) process.

DETAILED DESCRIPTION OF PARTICULAR EMBODIMENTS

The term "hydrocarbon group" (also designated as the group "R"), as used herein, refers, in a first embodiment, to a chemical group composed solely of carbon and hydrogen. In different embodiments, one or more of the hydrocarbon groups can contain precisely, at least, or greater than, for example, one, two, three, four, five, six, seven, eight, nine, ten, eleven, or twelve carbon atoms, or a particular range of carbon atoms bounded by any two of the foregoing carbon numbers.

The hydrocarbon group (R) can be, for example, saturated and straight-chained (i.e., straight-chained alkyl groups). Some examples of straight-chained alkyl groups include methyl, ethyl, n-propyl, n-butyl, n-pentyl, n-hexyl, n-heptyl, n-octyl, n-nonyl, n-decyl, n-undecyl, and n-dodecyl groups.

The hydrocarbon group (R) can alternatively be saturated and branched (i.e., branched alkyl groups). Some examples of branched alkyl groups include isopropyl (2-propyl), isobutyl (2-methylprop-1-yl), sec-butyl(2-butyl), t-butyl (1,1-dimethylethyl-1-yl), 2-pentyl, 3-pentyl, 2-methylbut-1-yl, isopentyl (3-methylbut-1-yl), 1,2-dimethylprop-1-yl, 1,1-dimethylprop-1-yl, neopentyl (2,2-dimethylprop-1-yl), 2-hexyl, 3-hexyl, 2-methylpent-1-yl, 3-methylpent-1-yl, isohexyl (4-methylpent-1-yl), 1,1-dimethylbut-1-yl, 1,2-dimethylbut-1-yl, 2,2-dimethylbut-1-yl, 2,3-dimethylbut-1-yl, 3,3-dimethylbut-1-yl, 1,1,2-trimethylprop-1-yl, 1,2,2-trimethylprop-1-yl, isoheptyl, isooctyl, and the numerous other $C_7$, $C_8$, $C_9$, $C_{10}$, $C_{11}$, and $C_{12}$ saturated and branched hydrocarbon groups, wherein the "1-yl" suffix represents the point of attachment of the group.

The hydrocarbon group (R) can alternatively be saturated and cyclic (i.e., cycloalkyl groups). Some examples of cycloalkyl groups include cyclopropyl, cyclobutyl, cyclopentyl, cyclohexyl, cycloheptyl, and cyclooctyl groups. The cycloalkyl group can also be a polycyclic (e.g., bicyclic or tricyclic) group by either possessing a bond between two ring groups (e.g., dicyclohexyl), or a shared (i.e., fused) side (e.g., decalin), or a bridging unit (e.g., norbornane).

The hydrocarbon group (R) can alternatively be unsaturated and straight-chained (i.e., straight-chained olefinic or alkenyl groups). The unsaturation occurs by the presence of one or more carbon-carbon double bonds and/or one or more carbon-carbon triple bonds. Some examples of straight-chained olefinic groups include vinyl, propen-1-yl (allyl), 3-buten-1-yl ($CH_2$=CH—$CH_2$—$CH_2$—), 2-buten-1-yl ($CH_2$—CH=CH—$CH_2$—), butadienyl, 4-penten-1-yl, 3-penten-1-yl, 2-penten-1-yl, 2,4-pentadien-1-yl, 5-hexen-1-yl, 4-hexen-1-yl, 3-hexen-1-yl, 3,5-hexadien-1-yl, 1,3,5-hexatrien-1-yl, 6-hepten-1-yl, ethynyl, propargyl (2-propynyl), and the numerous $C_7$, $C_8$, $C_9$, $C_{10}$, $C_{11}$, and $C_{12}$ unsaturated and straight-chained hydrocarbon groups.

The hydrocarbon group (R) can alternatively be unsaturated and branched (i.e., branched olefinic or alkenyl groups). Some examples of branched olefinic groups include propen-2-yl (CH$_2$=C.—CH$_3$), 1-buten-2-yl (CH$_2$=C.—CH$_2$—CH$_3$), 1-buten-3-yl (CH$_2$=CH—CH.—CH$_3$), 1-propen-2-methyl-3-yl (CH$_2$=C(CH$_3$)—CH$_2$—), 1-penten-4-yl, 1-penten-3-yl, 1-penten-2-yl, 2-penten-2-yl, 2-penten-3-yl, 2-penten-4-yl, and 1,4-pentadien-3-yl, and the numerous $C_6$, $C_7$, $C_8$, $C_9$, $C_{10}$, $C_{11}$, and $C_{12}$ unsaturated and branched hydrocarbon groups, wherein the dot in any of the foregoing groups indicates a point of attachment.

The hydrocarbon group (R) can alternatively be unsaturated and cyclic (i.e., cycloalkenyl groups or cycloalkenylene linkers). The unsaturated and cyclic group can be aromatic or aliphatic. Some examples of unsaturated and cyclic hydrocarbon groups include cyclopropenyl, cyclobutenyl, cyclopentenyl, cyclopentadienyl, cyclohexenyl, cyclohexadienyl, phenyl, benzyl, cycloheptenyl, cycloheptadienyl, cyclooctenyl, cyclooctadienyl, and cyclooctatetraenyl groups. The unsaturated cyclic hydrocarbon group can also be a polycyclic group (such as a bicyclic or tricyclic polyaromatic group) by either possessing a bond between two of the ring groups (e.g., biphenyl) or a shared (i.e., fused) side, as in naphthalene, anthracene, phenanthrene, phenalene, or indene fused ring systems.

The hydrocarbon group (R) may or may not also include one or more heteroatoms, such as one or more heteroatoms selected from oxygen, nitrogen, sulfur, and halogen atoms. Some particular examples of oxygen-containing groups include those of formula —OR' wherein R' is a hydrogen atom or a hydrocarbon group that optionally contains one or more heteroatoms selected from oxygen, nitrogen, sulfur, and/or halogen atoms. Other oxygen-containing groups include carbonyl groups (e.g., ketone, aldehyde, ester, amide, or urea functionalities). The —OR' group can also be a polyalkyleneoxide group, such as a polyethyleneoxide group. Some particular examples of nitrogen-containing groups include those of formula —NR'R" wherein R' and R" are each independently a hydrogen atom or hydrocarbon group optionally containing one or more heteroatoms selected from oxygen, nitrogen, sulfur, and/or halogen atoms. In addition, the nitrogen-containing groups can be primary amine groups, secondary amine groups, tertiary amine groups, or quaternary ammonium groups, wherein it is understood that a quaternary ammonium group necessarily possesses a positive charge that requires a counteranion. Some other nitrogen-containing groups may include cyanide, carboxamide (i.e., —C(O)NR'$_2$, wherein R' is independently selected from hydrogen atom and hydrocarbon group), nitro group, urea group, and carbamate group. Some examples of sulfur-containing groups include thiol (—SH), thioether (i.e., sulfide or —SR'), disulfide, sulfoxide, sulfone, sulfonate, and sulfate groups. Halogen atoms considered herein include fluorine, chlorine, bromine, and iodine. Some examples of fluorine-containing hydrocarbon groups (i.e., fluorocarbon groups) include the partially-substituted varieties (e.g., fluoromethyl, difluoromethyl, 2-fluoroethyl, 2,2-difluoroethyl, 2,2,2-trifluoroethyl, and the like) and perfluoro-substituted varieties (e.g., perfluoromethyl, perfluoroethyl, perfluoropropyl, perfluorobutyl, and the like).

The hydrocarbon group (R) may also include a ring structure (e.g., a monocyclic ring or polycyclic ring system) that includes or exclusively contains one or more (e.g., one, two, three, or four) ring nitrogen atoms in addition to ring carbon atoms. The nitrogen-containing rings can be, for example, saturated monocyclic, saturated polycyclic, unsaturated monocyclic, or unsaturated polycyclic. Some examples of saturated monocyclic nitrogen-containing ring groups include pyrrolidine, piperidine, piperazine, and morpholine groups. Some examples of unsaturated monocyclic nitrogen-containing ring groups include pyrrole, imidazole, pyrazole, pyridine, pyrazine, 1,3,5-triazine, pyrimidine, oxazole, thiazole, and thiazine groups. Some examples of saturated polycyclic nitrogen-containing ring systems include decahydroquinoline and decahydro-1,8-naphthyridine groups. Some examples of unsaturated polycyclic nitrogen-containing ring systems include indole, purine, benzimidazole, 4,4'-bipyridine, 2,2'-bipyridine, 1,8-naphthyridine, quinoline, quinazoline, phenazine, benzoxazole, benzothiazole, 2-phenylpyridine, 2,6-diphenylpyridine, and benzothiazine groups.

The hydrocarbon group (R) may also include a ring structure that includes or exclusively contains one or more (e.g., one, two, three, or four) ring oxygen atoms in addition to ring carbon atoms. The oxygen-containing rings can be, for example, saturated monocyclic, saturated polycyclic, unsaturated monocyclic, or unsaturated polycyclic. Some examples of saturated monocyclic oxygen-containing ring groups include tetrahydrofuran, tetrahydropyran, 1,4-dioxane, 1,3-dioxane, 1,3-dioxolane, and 1,4-oxathiane groups. Some examples of unsaturated monocyclic oxygen-containing ring groups include furan, pyran, and 1,4-dioxine groups. An example of a saturated polycyclic oxygen-containing ring system includes the octahydro-1-benzopyran group. Some examples of unsaturated polycyclic oxygen-containing ring systems include 1-benzopyran (chromene), 2-benzopyran (isochromene), 2-phenylfuran, 2-phenylpyran, coumarin, and 1,4-benzopyrone (chromone) groups.

The hydrocarbon group (R) may also include a ring structure that includes or exclusively contains one or more (e.g., one, two, three, or four) ring sulfur atoms in addition to ring carbon atoms. The sulfur-containing rings can be, for example, saturated monocyclic, saturated polycyclic, unsaturated monocyclic, or unsaturated polycyclic. Some examples of saturated monocyclic sulfur-containing ring groups include tetrahydrothiofuran, tetrahydrothiopyran, 1,4-dithiane, 1,3-dithiane, 1,2-dithiolane, and 1,4-dithiolane groups. Some examples of unsaturated monocyclic sulfur-containing ring groups include thiophene, thiopyran, and 1,4-dithiine groups. An example of a saturated polycyclic sulfur-containing ring system includes the octahydro-1-benzothiopyran group. Some examples of unsaturated polycyclic sulfur-containing ring systems include 1-thiobenzopyran (thiochromene), 2-benzothiopyran (isothiochromene), 2-phenylthiophene, 2-phenylthiofuran, 2,6-diphenylthiopyran, and thiocoumarin groups.

In some embodiments, any one or more classes or specific types of hydrocarbon groups are excluded from any of the components further described below.

In one aspect, the instant disclosure is directed to a tin-based solder melt or aqueous tin-based plating bath containing a source of tin (i.e., elemental tin for the case of the solder melt, and dissolved stannous ions in the case of the plating bath) and a hydrazone-containing compound that functions to prevent the formation of voids in a solder coat during application of a solder coat on a substrate. The hydrazone-containing compound is more typically a hydrazone-containing compound having at least one aromatic ring (e.g., a monocyclic ring or bicyclic or polycyclic ring system). Hereinafter, the hydrazone-containing compound is also referred to as a "stabilizing additive". Generally, the hydrazone compound should have a temperature of decomposition above the temperature of the molten solder into which it is incorporated.

In particular embodiments, the stabilizing additive has the following chemical structure:

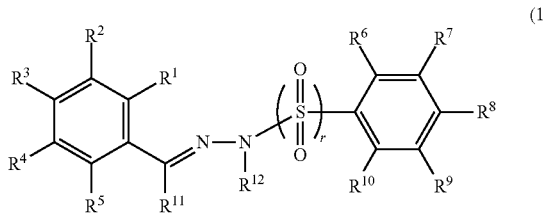

(1)

In Formula (1), $R^1$, $R^2$, $R^3$, $R^4$, $R^5$, $R^6$, $R^7$, $R^8$, $R^9$, and $R^{10}$ are independently selected from hydrogen atom, hydrocarbon groups R having at least one and up to twelve carbon atoms, groups OR' wherein R' is selected from hydrogen atom and hydrocarbon groups R, and halogen atoms. In some embodiments, at least one, two, three, or four, or all (or all but one, two, or three) of $R^1$, $R^2$, $R^3$, $R^4$, $R^5$, $R^6$, $R^7$, $R^8$, $R^9$, and $R^{10}$ are hydrogen atoms. In other embodiments, precisely or at least one, two, three, or four of $R^1$, $R^2$, $R^3$, $R^4$, $R^5$, $R^6$, $R^7$, $R^8$, $R^9$, and $R^{10}$ are hydrocarbon groups R having at least one and up to twelve carbon atoms, as described above. In particular embodiments, the hydrocarbon group R may be selected from straight-chained or branched alkyl or alkenyl groups having at least one or two and up to three, four, five, or six carbon atoms (e.g., methyl, ethyl, n-propyl, isopropyl, n-butyl, isobutyl, sec-butyl, t-butyl, n-pentyl, isopentyl, n-hexyl, isohexyl, vinyl, allyl, 2-propen-2-yl, and the like), and/or the hydrocarbon group R may be selected from saturated or unsaturated cyclic groups. In other embodiments, precisely or at least one, two, or three of $R^1$, $R^2$, $R^3$, $R^4$, $R^5$, $R^6$, $R^7$, $R^8$, $R^9$, and $R^{10}$ are OR' groups, wherein R' is selected from hydrogen atom and hydrocarbon groups R, as described above, including the aforesaid particular selections provided in this paragraph for R (e.g., hydroxy, methoxy, ethoxy, n-propoxy, isopropoxy, n-butoxy, isobutoxy, sec-butoxy, t-butoxy, vinyloxy, allyloxy, phenyloxy, benzyloxy, and the like). In other embodiments, precisely or at least one, two, or three of $R^1$, $R^2$, $R^3$, $R^4$, $R^5$, $R^6$, $R^7$, $R^8$, $R^9$, and $R^{10}$ are halogen atoms. The halogen atom can be, for example, a fluoro, chloro, bromo, or iodo atom. In some embodiments, the hydrocarbon group R or R' may be substituted with one or more heteroatoms, such as one or more halogen atoms (e.g., trifluoromethyl), oxygen atoms (e.g., 2-methoxyethyl or 2-hydroxyethyl), or nitrogen atoms (e.g., dimethylamino). In some embodiments, the shown sulfonyl group (—$SO_2$—) subtended by r may be replaced by a carbonyl (—C(=O)—) group, while in other embodiments, the shown sulfonyl group cannot be replaced. $R^{11}$ and $R^{12}$ are independently selected from hydrogen atom and hydrocarbon groups R having at least one and up to twelve carbon atoms. In particular embodiments, $R^{11}$ and $R^{12}$ are selected from straight-chained or branched alkyl or alkenyl groups having at least one or two and up to three, four, five, or six carbon atoms (e.g., methyl, ethyl, n-propyl, isopropyl, n-butyl, isobutyl, sec-butyl, t-butyl, n-pentyl, isopentyl, n-hexyl, isohexyl, vinyl, allyl, 2-propen-2-yl, and the like).

In some embodiments, any two, three, or four of $R^1$, $R^2$, $R^3$, $R^4$, and $R^5$ may be interconnected to form a fused ring system. Generally, only R groups adjacent to each other (e.g., $R^1$ and $R^2$, or $R^2$ and $R^3$) can be interconnected. Since the groups $R^1$, $R^2$, $R^3$, $R^4$, $R^5$, $R^6$, $R^7$, $R^8$, $R^9$, and $R^{10}$ are attached to phenyl rings, as shown in Formula (1), the interconnection of any of these groups naturally results in a fused ring system. For example, $R^1$ and $R^2$, or $R^2$ and $R^3$ (or alternatively, $R^3$ and $R^4$, or $R^4$ and $R^5$) can be interconnected as a butadiene linker, which results in a naphthyl group. In the case of $R^4$ and $R^5$ interconnecting to form a naphthyl group, the resulting structure may be conveniently depicted as follows:

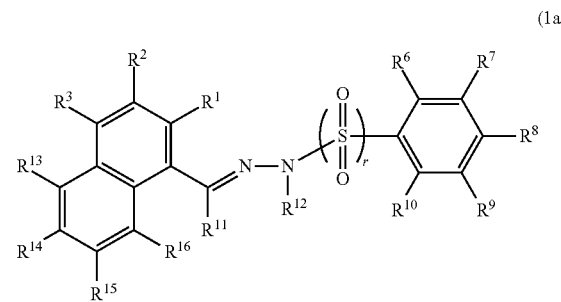

(1a)

In Formula (1a), $R^1$, $R^2$, $R^3$, $R^6$, $R^7$, $R^8$, $R^9$, $R^{10}$, $R^{11}$, $R^{12}$, and subscript r are defined as above, and $R^{13}$, $R^{14}$, $R^{15}$, and $R^{16}$ are independently selected from hydrogen atom, hydrocarbon groups R having at least one and up to twelve carbon atoms, groups OR' wherein R' is selected from hydrogen atom and hydrocarbon groups R, and halogen atoms, all as described above. Moreover, any two three, or four of $R^1$, $R^2$, $R^3$, $R^{13}$, $R^{14}$, $R^{15}$, and $R^{16}$ may be interconnected to form a larger fused ring system, e.g., $R^1$ and $R^2$ or $R^{14}$ and $R^{15}$ may be interconnected to result in an anthracene ring system, or $R^2$ and $R^3$ or $R^{13}$ and $R^{14}$ may be interconnected to result in a phenanthrene ring system, or $R^3$ and $R^{13}$ may be interconnected to result in a phenalene ring system.

Similarly, any two, three, or four of $R^6$, $R^7$, $R^8$, $R^9$, and $R^{10}$ in Formula (1) may be interconnected to form a fused ring system. For example, $R^6$ and $R^7$, or $R^7$ and $R^8$ (or alternatively, $R^9$ and $R^{10}$, or $R^8$ and $R^9$) can be interconnected as a butadiene linker, which results in a naphthyl group. In the case of $R^9$ and $R^{10}$ interconnecting to form a naphthyl group, the resulting structure may be conveniently depicted as follows:

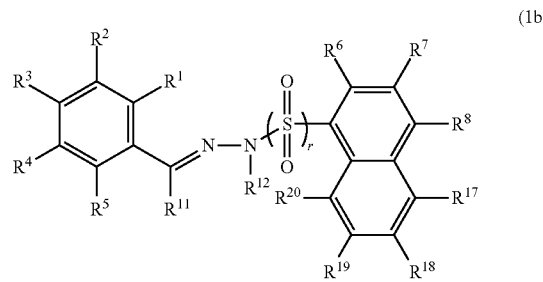

(1b)

In Formula (1b), $R^1$, $R^2$, $R^3$, $R^4$, $R^5$, $R^6$, $R^7$, $R^8$, $R^{11}$, $R^{12}$, and subscript r are defined as above, and $R^{17}$, $R^{18}$, $R^{19}$, and $R^{20}$ are independently selected from hydrogen atom, hydrocarbon groups R having at least one and up to twelve carbon atoms, groups OR' wherein R' is selected from hydrogen atom and hydrocarbon groups R, and halogen atoms, all as described above. Moreover, any two, three, or four of $R^6$, $R^7$, $R^8$, $R^{17}$, $R^{18}$, $R^{19}$, and $R^{20}$ may be interconnected to form a larger fused ring system, e.g., $R^6$ and $R^7$ or $R^{18}$ and $R^{19}$ may be interconnected to result in an anthracene ring system, or $R^7$ and $R^8$ or $R^{17}$ and $R^{18}$ may be interconnected to result in a phenanthrene ring system, or $R^8$ and $R^{17}$ may be interconnected to result in a phenalene ring system. In some embodiments, in addition to any two, three, or four of $R^6$, $R^7$, $R^8$, $R^9$, and $R^{10}$ in Formula (1) being interconnected to form a fused ring system, any two, three, or four of $R^1$, $R^2$, $R^3$, $R^4$, and $R^5$ may be interconnected to form a fused ring system, as discussed above under Formula (1a).

The groups $R^{11}$ and $R^{12}$ in Formula (1) and sub-formulas are independently selected from hydrogen atom and hydrocarbon groups R having at least one and up to twelve carbon atoms, as described above, including the particular selections provided above for R under Formula (1). In some embodiments, $R^{11}$ and $R^{12}$ are selected from hydrogen atom and alkyl groups having at least one or two and up to three or four carbon atoms. In some embodiments, $R^{11}$ and $R^{12}$ are both hydrogen atoms, while in other embodiments, one of $R^{11}$ and $R^{12}$ is a hydrocarbon group (e.g., alkyl group), while yet in other embodiments, both of $R^{11}$ and $R^{12}$ are hydrocarbon groups, such as alkyl groups.

The subscript r in Formula (1) and subformulas is either 0 or 1. When r is 1, the sulfonyl group is present, in which case Formula (1) can be expressed as follows:

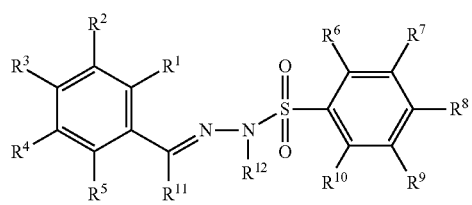

(1c)

In particular embodiments of Formula (1c), a naphthyl group may be present as in Formula (1a), which corresponds to a compound with the following structure:

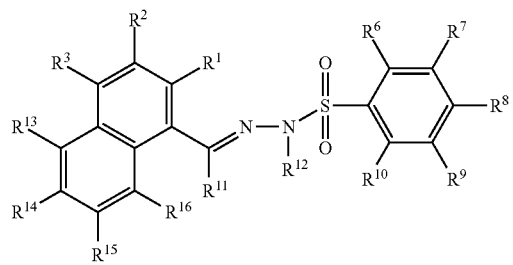

(1d)

In other particular embodiments of Formula (1c), a naphthyl group may be present as in Formula (1b), which corresponds to a compound with the following structure:

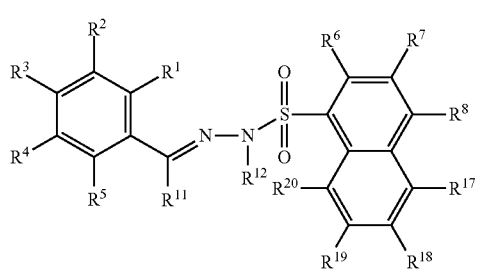

(1e)

When r is 0, the sulfonyl group is not present, in which case Formula (1) can be expressed as follows:

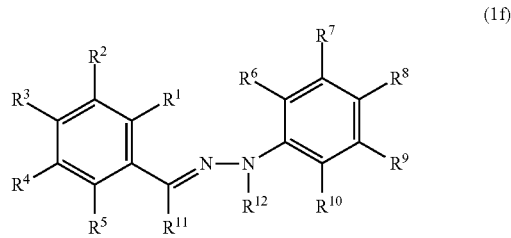

(1f)

In particular embodiments of Formula (1f), a naphthyl group may be present as in Formula (1a), which corresponds to a compound with the following structure:

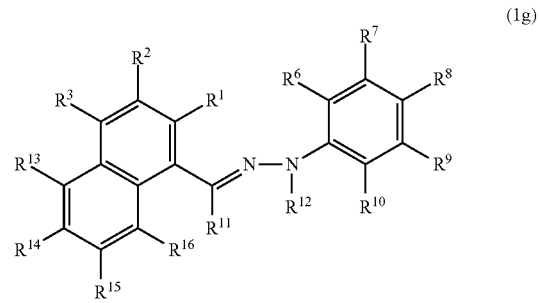

(1g)

In other particular embodiments of Formula (1f), a naphthyl group may be present as in Formula (1b), which corresponds to a compound with the following structure:

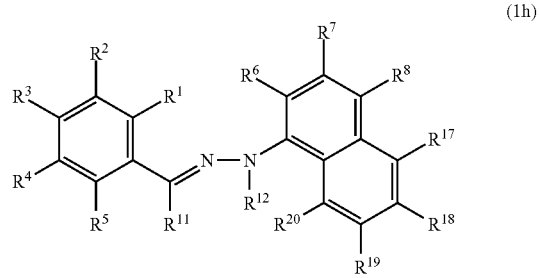

(1h)

The hydrazone compounds described above may be available commercially or may be synthesized by methods well known in the art. Such well known methods are provided, for example, in U.S. Pat. Nos. 8,314,247, 7,202,002, 7,193,067, 7,189,483, 6,835,514, 6,316,605, 6,077,866, 5,629,421, 5,288,727, and 4,606,987, the contents of which are herein incorporated by reference in their entirety. As well known in the art, any of a wide variety of hydrazone compounds can be synthesized by reacting a carbonyl compound (e.g., an aldehyde or ketone) with a hydrazinyl or hydrazidyl compound by a condensation mechanism under well-known conditions. Some examples of carbonyl compounds include benzaldehyde, diphenyl ketone, and naphthalene carboxaldehyde. Some examples of hydrazinyl compounds include phenylhydrazine, diphenylhydrazine, 2-naphthyl hydrazine, and anthracyl hydrazine. Some examples of hydrazidyl compounds include p-toluenesulfonylhydrazide and 1-naphthalenesulfonylhydrazide.

The hydrazone stabilizing compound is typically included in the solder melt in an amount (i.e., concentration) of at least 5 ppm by weight of the solder composition. In different embodiments, the amount of hydrazone compound is precisely, about, at least, above, up to, or less than, for example, 5, 10, 15, 20, 25, 30, 35, 40, 45, 50, 60, 70, 80, 90, or 100 ppm, or an amount within a range bounded by any two of the foregoing values, such as 5 to 100 ppm, or 10 to 100 ppm, or 5 to 40 ppm, or 10 to 40 ppm. In the case of an aqueous tin-based plating bath, the amount of the stabilizing compound can be any of the amounts provided above for the solder melt, or a higher amount, e.g., about, at least, above, up to, or less than, for example, 150 ppm (0.15 g/L), 200 ppm (0.2 g/L), 300 ppm (0.3 g/L), 400 ppm (0.4 g/L), or 500 ppm (0.5 g/L). The term "about", as used herein, generally indicates no more than ±20%, ±10%, ±5%, or ±1% of a value. Thus, a value of "about 10 ppm" generally indicates a maximal range of 8 to 12 ppm.

The tin-based solder in which the hydrazone compound is incorporated can be any of the tin-based solder melt compositions known in the art, as described, for example, in U.S. Pat. Nos. 4,758,407, 4,806,309, 5,352,407, 5,759,379, 6,805,974, 8,128,868, and 8,493,746, the contents of which are herein incorporated by reference in their entirety. Generally, the tin-based solder composition contains at least or greater than 20, 30, 40, 50, 60, 70, 80, 90, or 95 wt % tin by weight of the solder. In some embodiments, the tin-based solder composition is a lead-containing solder composition, such as the well known Sn/Pb 60/40, 63/37, 40/60, 50/50, 30/70, and 20/80 solder compositions. In other embodiments, the tin-based solder composition is a lead-free (Pb-free) solder composition. Some examples of lead-free solder compositions include those containing tin (Sn) alloyed with one or more other metals selected from, for example, silver, copper, bismuth, antimony, nickel, indium, gold, palladium, platinum, cadmium, and zinc, in which case the solder composition may be a binary, ternary, quaternary, or higher alloy. In particular embodiments, the lead-free solder is a tin-silver (Sn/Ag) binary, ternary, or higher alloy. Such lead-free solder compositions are described in further detail in, for example, U.S. Pat. Nos. 8,493,746, 8,128,868, 6,805,974, 5,874,043, 5,759,379, 5,352,407, 4,806,309, and 4,758,407, the contents of which are herein incorporated by reference in their entirety. In some embodiments, the tin-based solder may be substantially or completely free of one or more other metals, such as any one or more metals listed above (for example, cadmium), either in addition to or in place of lead. Alternatively, any one of the listed metals other than tin (e.g., Cu and/or Zn) may be present in the solder in a restricted amount, such as up to or less than 5, 4, 3, 2, 1, 0.5, 0.4, 0.3, 0.2, or 0.1 wt % by weight of the solder, or an amount bounded by any two of the foregoing values. In the case of a lead-containing solder, the lead-containing solder may or may not also include one or more other metals, such as those mentioned above. In some embodiments, the tin-based solder composition is composed of substantially only tin, such as at least or greater than 96%, 97%, 98%, or 99% tin, such as further described in U.S. Pat. No. 7,335,269, the contents of which are herein incorporated by reference in their entirety. The solder coat, as deposited by an aqueous plating bath, may also have any of the solder compositions described above, wherein the aqueous plating bath would necessarily include the metals ultimately deposited in the solder coating.

The tin-based solder may also have any suitable melting temperature, such as any of the low-melting or high-melting solder compositions known in the art. In different embodiments, the solder composition may have a melting temperature of precisely, about, at least, above, up to, or less than, for example, 100, 120, 150, 170, 180, 190, 200, 210, 220, 250, or 300° C., or a melting temperature within a range bounded by any two of the foregoing values. Generally, the solder composition should have a melting point (and more specifically, temperature at which it exists in the molten state) that is below the temperature at which the hydrazone compound decomposes. The melting point referred to above may be a solidus or liquidus melting point, but is more generally considered as the liquidus melting temperature since the solder is generally used when it is completely a liquid.

The aqueous tin-based plating bath can have any of the commonly chemistries known in the art, except that the plating bath includes a suitable amount of the hydrazone stabilizing compound described above. Modifications to the known plating baths (e.g., elimination or adjustment of one or more conventional compounds) to accommodate the instantly described stabilizing compound are contemplated. The presence of a substance that could be adversely reactive with the instantly described stabilizing compounds is particularly avoided. The chemistry of the plating bath can be based on any of the tin-based electrodeposition and electroless baths known in the art. In some embodiments, only tin is included as a plating metal, which results in only tin deposited on the substrate. In other embodiments, the tin plating bath includes one or more additional plating metals, as described above, to be co-deposited with tin, to result in the deposition of a tin-containing binary, ternary, or higher alloy on the substrate. The resulting tin-based alloy plated onto the substrate can have any of the compositions described above or as known in the art.

In some embodiments, the tin-based plating bath contains water as the only solvent, while in other embodiments, the plating bath includes water along with one or more water-soluble organic or inorganic solvents, such as one or more alcohols. The stannous ions are typically in the form of an aqueous-soluble salt of tin, such as stannous oxide, stannous sulfate, stannous sulfonate, stannous chloride, stannous nitrate, stannous fluoroborate, stannous fluorosilicate, stannous acetate, or stannic acid. Other dissolved metal ions (e.g., lead or silver) may be included to result in deposition of a tin-based alloy, e.g., silver tetrafluoroborate and lead tetrafluoroborate. The tin may be included in any suitable amount in the bath, typically within a range of 1-150 g/L or up to the solubility limit of the tin salt being used. Other metals to be co-deposited with tin may be independently included in an amount within the range provided for tin, or in an amount less than the amount of tin.

The tin-based plating bath may also include any of the additives commonly known in the art. For example, the plating bath may include a brightening agent, such as an alkoxy naphthalene carboxaldehyde compounds, as described in U.S. Pat. No. 3,977,949, the contents of which are herein incorporated by reference in their entirety. In other embodiments, the brightening agent may be, for example, β-naphthol, acetaldehyde, polyethylene glycol, triethanolamine, or malonic acid. The plating bath may also contain an emulsifying agent, such as those based on ethylene oxide chains and/or long chain fatty alcohols, fatty acids, fatty amines, and phenols, as also described in the above-cited patent. The inclusion of alpha unsaturated compounds (e.g., cinnamic acid, acrylic acid, methacrylic acid, and crotonic acid) is also well known. The plating bath also typically includes at least one type of mineral or organic acid, such as sulfuric acid (typically in an amount of 10-60 g/L), a hydrocarbyl-substituted sulfonic acid, a carboxylic acid, phosphoric acid, citric acid, tartaric acid, sulfamic acid, malic acid, or maleic acid. The plating bath is commonly maintained at a pH of 0 to 3, or 0 to 2, or 0 to 1, but a higher pH (e.g., of 4-10) may be employed, particularly when a weak organic acid or even a weak base is used. The plating bath may also include a complexing agent for tin and/or other metal ions that may be included. The complexing agent may be, for example, any of the sulfur-containing compounds known in the art for this purpose, such as a thiourea, imidazole-2-thione, thiocarbamate, thiazole, methionine, cysteine, thio derivatives of alkyl glycols, alkali metal polysulfides, and the like. In other embodiments, the complexing agent is based on a pyrophosphoric acid compound. The plating bath typically also includes a surfactant, which may also be referred to as a wetting agent, particularly a non-ionic surfactant, more particularly those surfactants having ether functionalities, such as polyethylene glycols or nonionic polyoxyethylene compounds, as described in U.S. Pat. No. 3,855,085. A quaternary ammonium surfactant, such as benzalkonium chloride, or an ammonium heterocyclic species, such as an imidazolium or pyridinium salt, may also be used. Particularly for electroless tin plating baths, a reducing agent, such as a hypophosphite salt (e.g., sodium hypophosphite), is also typically included. An antioxidant, such as hydroquinone, may also be included, in which case the antioxidant may also serve as a reducing agent. Numerous types of plating baths containing the above or similar components are known in the art, as evidenced, for example, in U.S. Pat. Nos. 7,713,859, 7,695,605, 6,361,823, 6,544,398, 5,902,472, 5,334,240, 5,326,453, 5,266,103, 4,511,403, 4,405,663, 4,263,106, 4,027,055, 3,977,949, and 2,891,871, the contents of which are herein incorporated by reference in their entirety. In some embodiments, any one or more of the above components may be excluded from the tin plating bath.

In another aspect, the instant disclosure is directed to methods for coating a metal substrate with any of the tin-based solder melts or aqueous tin-based plating baths described above. Methods for applying tin-based coats onto metal substrates from solder melts and aqueous based solutions are well known in the art, as evidenced by the above listing of patents, and all such knowledge applies herein, as appropriately modified to accommodate the presence of the instantly described hydrazone stabilizer.

In the case of a tin-based solder melt, a metal substrate is contacted with a molten (i.e., liquid) form of the solder composition described above. The hydrazone stabilizing compound is generally added and mixed into the molten form of the solder prior to contact of the substrate with the solder. The contacting may be performed by any of the methods commonly known in the art, such as by dipping the substrate into the molten solder, or by contacting the solder in solid form with the substrate and heating the solder until it melts. In some embodiments, a metallic substrate is coated with a layer of the solder followed by cooling and solidification for later use in bonding to other components (e.g., by solder reflow, typically used in conjunction with a solder mask). In other embodiments, a component is bonded to a metallic substrate by direct soldering of the two parts with molten solder (e.g., wave soldering), all of which includes, at least initially, coating the substrate with the solder. Depending on the application and process, a solder flux may or may not be applied to the substrate prior to contact with the molten solder.

In the case of an aqueous plating bath, the metal substrate is at least partly or completely submerged into the plating solution. For an electroless process, the substrate is maintained in the solution for a suitable time period in the absence of an applied current until the part is sufficiently plated. For an electrodeposition process, the substrate is maintained in the solution for a suitable time period under an applied current until the part is sufficiently plated. Any appropriate anode composition known in the art, such as tin (e.g., tin oxide), tin-lead, or platinum, may be used in the electrodeposition process, wherein the substrate is configured as the cathode during electrodeposition. In the electrodeposition process, any suitable current density may be used, such as at least or above 1, 2, or 5 amperes per square foot (ASF) and up to or less than 10, 20, 50, 100, 150, or 200 ASF, and within a processing time period to achieve a desired plating thickness (typically within at least 1, 5, 10, or 20 and up to 50, 100, 200, 300, 400, or 500 microinches). The plating bath may also be set at any suitable temperature during use, typically at least room temperature (e.g., about 20, 25, or 30° C.) and up to 40, 50, 60, 70, 80, 90, or 100° C. In some embodiments, after deposition of the tin plate, the substrate with tin coating is reflowed, e.g., at a temperature of about 235° C. for 15-30 seconds.

Typically, the substrate undergoes a preparation or priming process, which generally entails at least a cleaning process, before the substrate is treated in the tin deposition process. For example, in the case of a copper substrate, the substrate may be treated with a dilute acid solution (e.g., hydrochloric acid) and/or a light etching solution (e.g., aqueous ammonium persulfate).

The metal substrate can be any of the metal substrates known in the art that can benefit from being coated with tin solder or that may be bonded to another substrate by use of tin solder. The metal substrate typically includes or is composed of copper (Cu) or zinc (Zn) or a combination thereof, although the substrate may include or be composed of other metals, such as nickel (Ni) or aluminum (Al). In one embodiment, the metal substrate is a component of an electronic or printed circuit board. In more particular embodiments, the soldering process is used to join an integrated circuit chip to a chip carrier, or to join a chip carrier to a substrate, or to join circuit paths or pads in a multilayer printed circuit board. The pads are typically constructed of, for example, copper or nickel-gold plated copper. In some embodiments, the solder may be in the form of solder balls or chip bumps, which can be used in a ball grid array (BGA) or flip chip (C4) manufacturing process for bonding a chip or chip carrier to a circuit board. In another embodiment, the metal substrate is a physically functional or structural part, such as piping as used in plumbing, or bulk leads or wires to be bonded.

While there have been shown and described what are presently believed to be the preferred embodiments of the present invention, those skilled in the art will realize that other and further embodiments can be made without departing from the spirit and scope of the invention described in this application, and this application includes all such modifications that are within the intended scope of the claims set forth herein.

The invention claimed is:

1. A tin-based solder composition comprising elemental tin and a stabilizing additive having the following chemical structure:

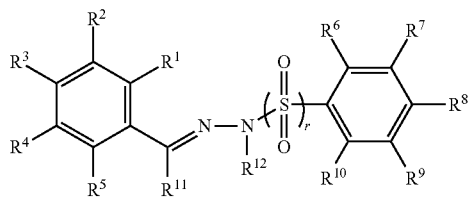

(1)

wherein:
$R^1$, $R^2$, $R^3$, $R^4$, $R^5$, $R^6$, $R^7$, $R^8$, $R^9$, and $R^{10}$ are independently selected from hydrogen atom, hydrocarbon groups R having at least one and up to twelve carbon atoms, groups OR' wherein R' is selected from hydrogen atom and hydrocarbon groups R, and halogen atoms, and wherein any two, three, or four of $R^1$, $R^2$, $R^3$, $R^4$, and $R^5$ are optionally interconnected to form a fused ring system; and wherein any two, three, or four of $R^6$, $R^7$, $R^8$, $R^9$, and $R^{10}$ are optionally interconnected to form a fused ring system;

$R^{11}$ and $R^{12}$ are independently selected from hydrogen atom and hydrocarbon groups R having at least one and up to twelve carbon atoms; and the subscript r is either 0 or 1.

2. The solder composition of claim 1, wherein the stabilizing additive has the formula:

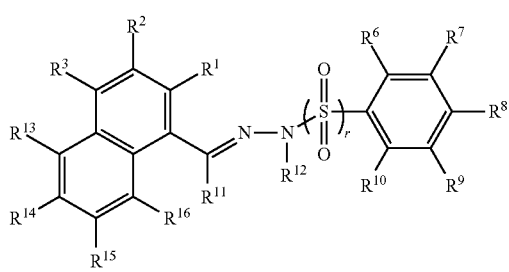

(1a)

wherein $R^1$, $R^2$, $R^3$, $R^6$, $R^7$, $R^8$, $R^9$, $R^{10}$, $R^{11}$, $R^{12}$, and subscript r are defined as in claim 1, and $R^{13}$, $R^{14}$, $R^{15}$, and $R^{16}$ are independently selected from hydrogen atom, hydrocarbon groups R having at least one and up to twelve carbon atoms, groups OR' wherein R' is selected from hydrogen atom and hydrocarbon groups R, and halogen atoms, and wherein any two, three, or four of $R^1$, $R^2$, $R^3$, $R^{13}$, $R^{14}$, $R^{15}$, and $R^{16}$ are optionally interconnected to form a larger fused ring system; and wherein any two, three, or four of $R^6$, $R^7$, $R^8$, $R^9$, and $R^{10}$ are optionally interconnected to form a fused ring system.

3. The solder composition of claim 1, wherein the stabilizing additive is present in an amount of at least 10 ppm in the solder composition.

4. The solder composition of claim 3, wherein the stabilizing additive is present in an amount of up to 100 ppm in the solder composition.

5. The solder composition of claim 3, wherein the stabilizing additive is present in an amount of up to 40 ppm in the solder composition.

6. The solder composition of claim 1, wherein the tin-based solder composition is lead-free.

7. The solder composition of claim 6, wherein the lead-free tin-based solder composition is a tin-silver alloy solder composition.

8. An aqueous tin plating bath comprising dissolved stannous ions, water, and a stabilizing additive having the following chemical structure:

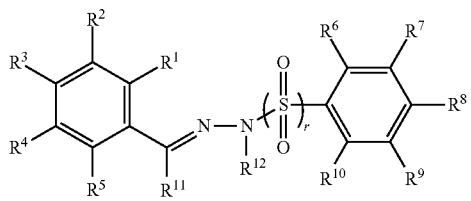

(1)

wherein:
$R^1$, $R^2$, $R^3$, $R^4$, $R^5$, $R^6$, $R^7$, $R^8$, $R^9$, and $R^{10}$ are independently selected from hydrogen atom, hydrocarbon groups R having at least one and up to twelve carbon atoms, groups OR' wherein R' is selected from hydrogen atom and hydrocarbon groups R, and halogen atoms, and wherein any two, three, or four of $R^1$, $R^2$, $R^3$, $R^4$, and $R^5$ are optionally interconnected to form a fused ring system; and wherein any two, three, or four of $R^6$, $R^7$, $R^8$, $R^9$, and $R^{10}$ are optionally interconnected to form a fused ring system;

$R^{11}$ and $R^{12}$ are independently selected from hydrogen atom and hydrocarbon groups R having at least one and up to twelve carbon atoms; and the subscript r is either 0 or 1.

9. The aqueous tin plating bath of claim 8, wherein the stabilizing additive has the formula:

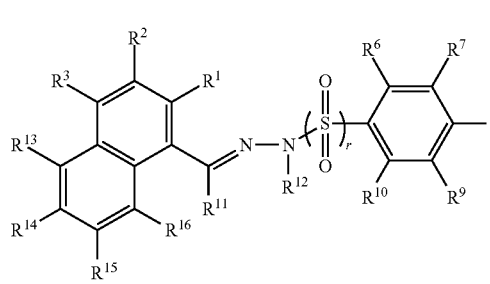

(1a)

wherein $R^1$, $R^2$, $R^3$, $R^6$, $R^7$, $R^8$, $R^9$, $R^{10}$, $R^{11}$, $R^{12}$, and subscript r are defined as in claim 8, and $R^{13}$, $R^{14}$, $R^{15}$, and $R^{16}$ are independently selected from hydrogen atom, hydrocarbon groups R having at least one and up to twelve carbon atoms, groups OR' wherein R' is selected from hydrogen atom and hydrocarbon groups R, and halogen atoms, and wherein any two, three, or four of $R^1$, $R^2$, $R^3$, $R^{13}$, $R^{14}$, $R^{15}$, and $R^{16}$ are optionally interconnected to form a larger fused ring system; and wherein any two, three, or four of $R^6$, $R^7$, $R^8$, $R^9$, and $R^{10}$ are optionally interconnected to form a fused ring system.

10. A method of coating a metal substrate with a tin-based solder composition, the method comprising contacting said metal substrate with a molten form of said tin-based solder composition followed by removing said metal substrate from the molten form of said tin-based solder composition and cooling said metal substrate to form a solid coating of said tin-based solder composition, wherein said tin-based solder composition comprises elemental tin and a stabilizing additive having the following chemical structure:

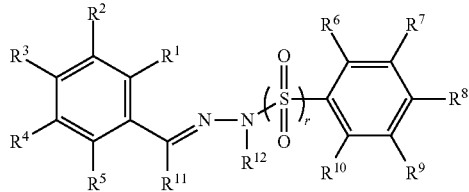

wherein:

$R^1$, $R^2$, $R^3$, $R^4$, $R^5$, $R^6$, $R^7$, $R^8$, $R^9$, and $R^{10}$ are independently selected from hydrogen atom, hydrocarbon groups R having at least one and up to twelve carbon atoms, groups OR' wherein R' is selected from hydrogen atom and hydrocarbon groups R, and halogen atoms, and wherein any two, three, or four of $R^1$, $R^2$, $R^3$, $R^4$, and $R^5$ are optionally interconnected to form a fused ring system; and wherein any two, three, or four of $R^6$, $R^7$, $R^8$, $R^9$, and $R^{10}$ are optionally interconnected to form a fused ring system;

$R^{11}$ and $R^{12}$ are independently selected from hydrogen atom and hydrocarbon groups R having at least one and up to twelve carbon atoms; and the subscript r is either 0 or 1.

11. The method of claim 10, wherein the stabilizing additive has the formula:

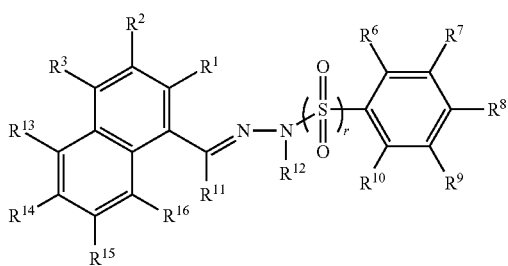

wherein $R^1$, $R^2$, $R^3$, $R^6$, $R^7$, $R^8$, $R^9$, $R^{10}$, $R^{11}$, $R^{12}$, and subscript r are defined as in claim 10, and $R^{13}$, $R^{14}$, $R^{15}$, and $R^{16}$ are independently selected from hydrogen atom, hydrocarbon groups R having at least one and up to twelve carbon atoms, groups OR' wherein R' is selected from hydrogen atom and hydrocarbon groups R, and halogen atoms, and wherein any two, three, or four of $R^1$, $R^2$, $R^3$, $R^{13}$, $R^{14}$, $R^{15}$, and $R^{16}$ are optionally interconnected to form a larger fused ring system; and wherein any two, three, or four of $R^6$, $R^7$, $R^8$, $R^9$, and $R^{10}$ are optionally interconnected to form a fused ring system.

12. The method of claim 10, wherein the stabilizing additive is present in an amount of at least 10 ppm in the solder composition.

13. The method of claim 12, wherein the stabilizing additive is present in an amount of up to 100 ppm in the solder composition.

14. The method of claim 12, wherein the stabilizing additive is present in an amount of up to 40 ppm in the solder composition.

15. The method of claim 10, wherein the tin-based solder composition is lead-free.

16. The method of claim 15, wherein the lead-free tin-based solder composition is a tin-silver alloy solder composition.

17. The method of claim 10, wherein the metal substrate is a copper-containing or zinc-containing substrate.

18. A method of coating a metal substrate with a tin-based solder composition, the method comprising contacting said metal substrate with an aqueous tin plating bath comprising dissolved stannous ions, water, and a stabilizing additive having the following chemical structure:

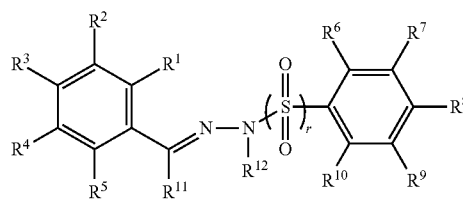

wherein:

$R^1$, $R^2$, $R^3$, $R^4$, $R^5$, $R^6$, $R^7$, $R^8$, $R^9$, and $R^{10}$ are independently selected from hydrogen atom, hydrocarbon groups R having at least one and up to twelve carbon atoms, groups OR' wherein R' is selected from hydrogen atom and hydrocarbon groups R, and halogen atoms, and wherein any two, three, or four of $R^1$, $R^2$, $R^3$, $R^4$, and $R^5$ are optionally interconnected to form a fused ring system; and wherein any two, three, or four of $R^6$, $R^7$, $R^8$, $R^9$, and $R^{10}$ are optionally interconnected to form a fused ring system;

$R^{11}$ and $R^{12}$ are independently selected from hydrogen atom and hydrocarbon groups R having at least one and up to twelve carbon atoms; and the subscript r is either 0 or 1.

19. The method of claim 18, wherein the stabilizing additive has the formula:

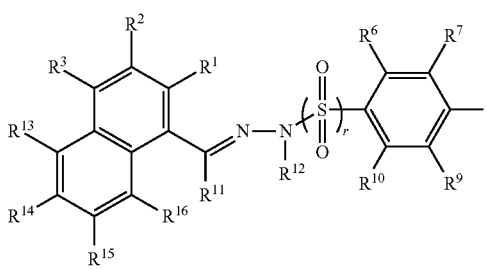

wherein $R^1$, $R^2$, $R^3$, $R^6$, $R^7$, $R^8$, $R^9$, $R^{10}$, $R^{11}$, $R^{12}$, and subscript r are defined as in claim 18, and $R^{13}$, $R^{14}$, $R^{15}$, and $R^{16}$ are independently selected from hydrogen atom, hydrocarbon groups R having at least one and up to twelve carbon atoms, groups OR' wherein R' is selected from hydrogen atom and hydrocarbon groups R, and halogen atoms, and wherein any two, three, or four of $R^1$, $R^2$, $R^3$, $R^{13}$, $R^{14}$, $R^{15}$, and $R^{16}$ are optionally interconnected to form a larger fused ring system; and wherein any two, three, or four of $R^6$, $R^7$, $R^8$, $R^9$, and $R^{10}$ are optionally interconnected to form a fused ring system.

20. The method of claim 18, wherein the metal substrate is a copper-containing or zinc-containing substrate.

* * * * *